United States Patent

Abiko et al.

[11] Patent Number: 6,104,137
[45] Date of Patent: Aug. 15, 2000

[54] ORGANIC ELECTROLUMINESCENT DISPLAY DEVICE

[75] Inventors: Hirosi Abiko; Yoshihiro Ogata, both of Yonezawa, Japan

[73] Assignees: Pioneer Electronic Corporation, Tokyo; Tohoku Pioneer Electronic Corporation, Tendo, both of Japan

[21] Appl. No.: 09/119,235

[22] Filed: Jul. 21, 1998

[30] Foreign Application Priority Data

Jul. 22, 1997 [JP] Japan ................................ 9-195726

[51] Int. Cl.[7] ............................ C09K 11/06; H05B 33/04
[52] U.S. Cl. ...................... 313/506; 313/503; 313/504; 427/917
[58] Field of Search .................... 313/506, 505, 313/504, 567, 637; 428/690, 917; 315/169.3

[56] References Cited

U.S. PATENT DOCUMENTS 5,012,156  4/1991  Kadokura et al. ................. 313/506 X
5,589,732  12/1996  Okibayashi et al. .................... 313/506
5,771,562  6/1998  Harvey, III et al. ............... 313/504 X

*Primary Examiner*—Ashok Patel
*Attorney, Agent, or Firm*—Evenson, McKeown, Edwards & Lenanhan, P.L.L.C.

[57] ABSTRACT

An organic electroluminescent display device includes an organic electroluminescent element formed on a substrate thereof and having an organic compound layer group sandwiched between cathodes and anodes. The organic compound layer group has laminated electroluminescence functional layers formed of at least one kind of organic compound. Further, the organic electroluminescent display device includes an airtight case that encloses the organic electroluminescent element with a space formed between the airtight case itself and the organic electroluminescent element and isolates the organic electroluminescent element from outside air, and a filler gas filling the space within the airtight case. The filler gas contains at least one kind of combustion supporting gas.

13 Claims, 1 Drawing Sheet

ORGANIC ELECTROLUMINESCENT DISPLAY DEVICE

BACKGROUND OF THE INVENTION

1. Field of the Invention

This invention relates to an electroluminescent display (EL display) device comprising electroluminescent elements (EL elements) each having electroluminescent layers (EL layers) which generate light with application of an electric field thereto.

2. Description of the Related Art

Conventionally, a cathode ray tube (CRT) or a liquid crystal element is widely used for a display device which is capable of displaying multiple colors in response to electric signals. Further, there have been developed an EL display device comprised of a plurality of completely solid-state EL elements which are capable of emitting very bright light by electroluminescence.

When classified according to the material of a light-emitting layer of an EL element which emits light with application of an electric current, there are two groups of EL display devices: a group using an EL element having an inorganic light-emitting layer and a group using one having an organic light-emitting layer. In recent years, much attention has been focused on the EL elements having an organic light-emitting layer.

An organic EL element is comprised of a pair of electrodes and laminated layers of organic fluorescent materials, such as a hole transport layer, a light-emitting layer, and an electron injection layer, which are formed between the electrodes. FIG. 1 shows an example of an organic EL display device of X-Y matrix type. This device includes EL elements 10 each having a two-layered structure. The EL element 10 has a plurality of transparent electrode stripes (anodes) 2 formed of indium tin oxide (ITO) or the like on a transparent glass substrate 1 on which a hole transport layer 3 and an organic light-emitting layer 4 are deposited in the mentioned order, on which a plurality of back electrodes (cathodes) 6 are formed and arranged crosswise to the transparent electrodes 2. The EL elements at intersections of the electrodes 2 and 6 form a matrix of light-emitting points corresponding to pixels. In addition to the illustrated type having the two-layered structure of the hole transport layer 3 and the organic light-emitting layer 4, there are other types of organic EL display device, such as one using EL elements of a three-layered structure type having a layer of an organic electron transport layer additionally provided between the organic light-emitting layer 4 and the back electrodes 6, and another using multiple-layered EL elements formed of still more layers. It should be noted that the hole transport layer, the organic light-emitting layer, the electron transport layer, and the like are also referred to as "organic electroluminescence functional layers".

The organic light-emitting layer 4 of the organic EL element 10 is a layer including a fluorescent material such as a coumarin compound. When application of a voltage across the electrodes 2 and 6, the organic hole transport layer 3 has the functions of facilitating injection of holes from the positive electrodes and blocking electrons, while the organic electron transport layer has the function of facilitating injection of electrons from the negative electrode. In the organic EL element 10, an electron and a hole injected from the corresponding electrodes are recombined to generate an exciton. The exciton emits light upon deactivation thereof, and the light is sent out via the transparent electrode and the glass substrate.

However, if the last layered cathode formed of Aluminum Al, for example, has a pinhole 7 as shown in FIG. 1, then moisture, oxygen or the like permeates into the organic layers of the EL element 10 through the pinhole 7 to cause an increase in the electrical resistance at an interface between the cathode 6 and the light-emitting layer 4 (or separation of the cathode 6 from the layer 4), or cause deterioration of the organic electroluminescence functional layers, whereby an electroluminescence-disabled region, i.e., a dark spot 8 is produced.

Further, there may be a little possibility of dust adhesion 15 on the organic EL display as shown in FIG. 1. Since the organic electroluminescence functional layers have a very small thickness of a submicron order, a short circuit due to the dust 15 is liable to occur between the transparent electrode (anode) 2 and the back electrode (cathode) 6 as shown in FIG. 1. The conventional countermeasure for preventing occurrence of short circuits are washing and smoothing of the surface of the substrate. However, it is impossible to perfectly clean the substrate surface, there still remains possibility of occurrence of short circuits.

SUMMARY OF THE INVENTION

The present invention has been made in view of the above circumstances, and an object thereof is to provide a reliable EL display device having a construction which is capable of reducing the possibility of occurrence of a short circuit.

To attain the above object, the present invention provides an organic EL display device comprising:

a substrate;

an organic EL element formed on the substrate, the organic EL element having an organic compound layer group sandwiched between cathodes and anodes, the organic compound layer group comprising laminated electroluminescence functional layers formed of at least one kind of organic compound;

an airtight case that encloses the organic EL element including the organic compound layer group, the cathodes and the anodes with a space formed between the airtight case itself and the organic EL element, and isolates the organic EL element from outside air; and a filler gas filling the space within the airtight case, the filler gas including at least one kind of combustion supporting gas.

In an embodiment of the organic EL display device, it is characterized in that said combustion supporting gas is oxygen gas. In this embodiment, it is characterized in that a concentration of said oxygen gas is equal to or higher than 1 vol % in said filler gas.

In an embodiment of the organic EL display device, it is characterized in that said combustion supporting gas is dinitrogen oxide gas. In this embodiment, it is characterized in that a concentration of said dinitrogen oxide gas is equal to or higher than 2 vol % in said filler gas.

In an embodiment of the organic EL display device, it is characterized in that said combustion supporting gas is ozone gas.

In an embodiment of the organic EL display device, it is characterized in that said combustion supporting gas is chlorine gas.

In an embodiment of the organic EL display device, it is characterized in that said combustion supporting gas is nitrogen monoxide gas.

In an embodiment of the organic EL display device, it is characterized in that said combustion supporting gas is fluorine gas.

In an embodiment of the organic EL display device, it is characterized in that said combustion supporting gas is nitrogen trifluoride gas.

In an embodiment of the organic EL display device, it is characterized in that said combustion supporting gas is oxygen difluoride gas.

In an embodiment of the organic EL display device, it is characterized in that said combustion supporting gas is chlorine trioxide fluoride gas.

In an embodiment of the organic EL display device, it is characterized in that said filler gas includes at least of one of nitrogen gas and inert gases.

According to the EL display device having the above construction, the combustion supporting gas oxidizes a portion surrounding a pinhole produced in a cathode or a discontinued portion of the same. Further, since a short-circuited portion generates heat, the cathode material of the portion is easily oxidized to form an insulator, thereby to suppress occurrence of a short circuit. A combustion supporting gas is a gas-oxidizing agent that does not burn itself, but helps combustion of other materials.

The above set forth and other features of the invention are made more apparent in the ensuing "Detailed Description of the Preferred Invention" when read in conjunction with the attached Drawings.

DETAILED DESCRIPTION OF THE PREFERRED EMBODIMENTS

Figure 1:
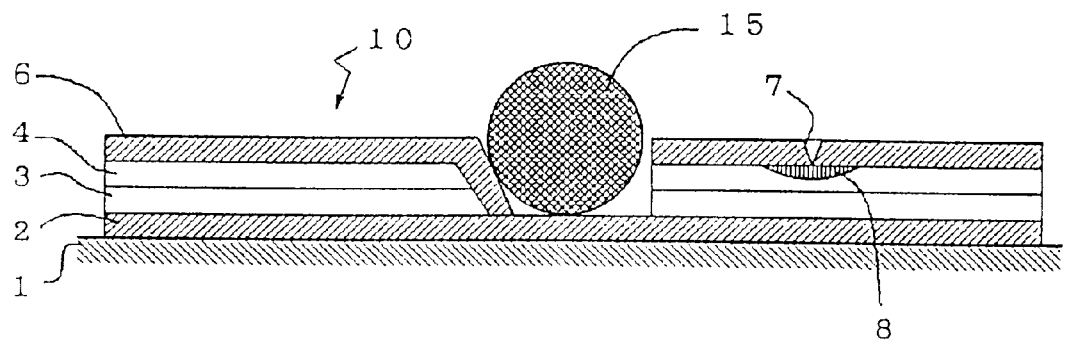
FIG. 1 is an enlarged sectional view schematically showing a part of a conventional organic EL element.
Figure 2:
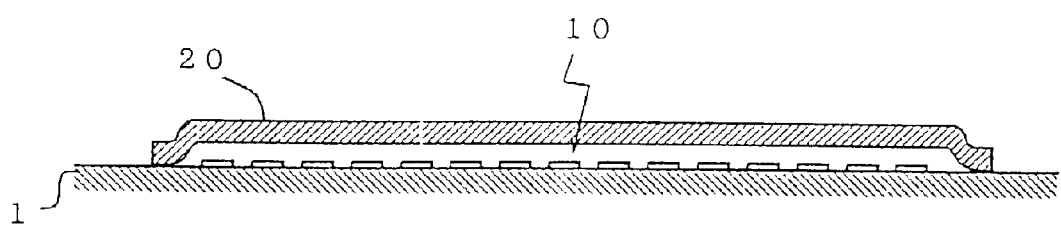
FIG. 2 is an enlarged sectional view schematically showing a part of an EL display device according to an embodiment of the invention.

Referring first to FIG. 2, there is shown an EL display device according to an embodiment of the invention. The EL display device includes a transparent glass substrate 1, EL elements 10, and an airtight case 20 hermetically bonded onto the glass substrate 1 in a manner enclosing the EL elements 10 with a space formed between the elements 10 and the case 20 itself. Each of the EL elements 10 has the organic electroluminescence functional layers of a hole transport layer and an organic light-emitting layer, which are formed one upon the other between a pair of electrodes. The airtight case 20 protects the organic compound layers of the elements 10 from the outside air having a high water content. The space within the airtight case 20 is filled with a filler gas containing at least one kind of combustion supporting gas such as oxygen. A gas mixed with the combustion supporting gas may be an inert gas such as $N_2$, Ar, or Ne, or a combination thereof.

Figure 3:
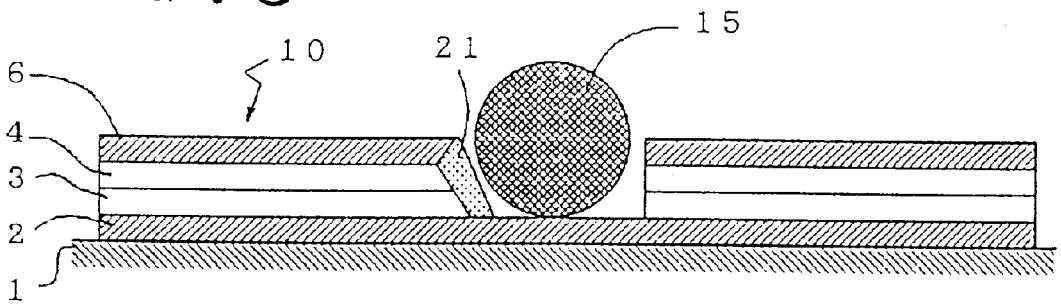
FIG. 3 is an enlarged sectional view schematically showing a part of an EL display device according to an embodiment of the invention having a two-layered structure type.

The EL element 10 according to the embodiment is a two-layered structure type, as shown in FIG. 3, in which a transparent electrode 2 comprised of a plurality of striped anodes formed, for example, of ITO, a hole transport layer 3, an organic light-emitting layer 4, and a back electrode 6 comprised of a plurality of striped cathodes formed of Al arranged crosswise to the transparent electrode 2 are laminated one upon another on the glass transparent substrate 1 in the mentioned order. The hole transport layer 3 and the organic light-emitting layer 4 form a group of laminated organic compound layers.

As Examples, a glass substrate having ITO anodes formed thereon in a stripe pattern is fully washed, and then a hole transport layer of TPD having a thickness of 700 Å, a light-emitting layer of $Alq_3$ having a thickness of 550 Å, and stripes of Al cathodes having a thickness of 1000 Å in a stripe pattern are successively formed on the striped anodes on the substrate by vacuum deposition. Finally, an airtight case is hermetically bonded to the substrate, and the internal space is filled with a filler gas which is a mixture of a plurality of kinds of gases, followed by sealing. Further, the airtight case 10 has an inner wall formed to include CaO so as to absorb moisture.

Next, performance tests were carried out on organic EL elements thus obtained and each having 64×256 pixels, by causing each to emit light at a luminance of 200 cd/m$^2$, at a temperature of 85° C. for 2 hours, and then at a temperature of −40° C. for 96 hours.

Table 1 shows results of performance tests carried out under conditions in which the filler gas within the airtight case was a mixture of an oxygen gas and a nitrogen gas, with varied oxygen concentrations of 0.5 vol %, 1 vol %, 3 vol %, 6 vol %, 10 vol %, 15 vol %, 20 vol %, 50 vol %, and 100 vol %, respectively.

Table 2 shows results of performance tests carried out under conditions in which the filler gas within the airtight case was a mixture of a dinitrogen oxide gas and a nitrogen gas, with varied dinitrogen oxide concentrations of 1 vol %, 2 vol %, 10 vol %, 20 vol %, 50 vol %, and 100 vol %, respectively.

Table 3 shows results of performance test carried out under conditions in which the filler gas within the airtight case 20 was a mixture of a combustion supporting gas of ozone, chlorine, nitrogen monoxide, fluorine, nitrogen trifluoride, oxygen difluoride, or chlorine trioxide fluoride, and a nitrogen gas, with the concentration of each combustion supporting gas being 5 vol %.

As Comparative Example, organic EL elements constructed similarly to the embodiment except that the space inside the airtight case was filled with the nitrogen gas alone, and the performance test was carried out in the same manner. Table 1 shows results of this test.

TABLE 1

|  | Combustion Supporting gas | Concentration [vol %] | Unlighted pixels |
|---|---|---|---|
| Comparative Example | — | 0 | 22 |
| Example 1 | $O_2$ | 0.5 | 18 |
| Example 2 | $O_2$ | 1 | 0 |
| Example 3 | $O_2$ | 3 | 0 |
| Example 4 | $O_2$ | 6 | 0 |
| Example 5 | $O_2$ | 10 | 0 |
| Example 6 | $O_2$ | 15 | 0 |
| Example 7 | $O_2$ | 20 | 0 |
| Example 8 | $O_2$ | 50 | 0 |
| Example 9 | $O_2$ | 100 | 0 |

TABLE 2

|  | Combustion Supporting gas | Concentration [vol %] | Unlighted pixels |
|---|---|---|---|
| Example 10 | $N_2O$ | 1 | 15 |
| Example 11 | $N_2O$ | 2 | 0 |

TABLE 2-continued

|  | Combustion Supporting gas | Concentration [vol %] | Unlighted pixels |
|---|---|---|---|
| Example 12 | $N_2O$ | 10 | 0 |
| Example 13 | $N_2O$ | 20 | 0 |
| Example 14 | $N_2O$ | 50 | 0 |
| Example 15 | $N_2O$ | 100 | 0 |

TABLE 3

|  | Combustion Supporting gas | Concentration [vol %] | Unlighted pixels |
|---|---|---|---|
| Example 16 | $O_3$ | 5 | 0 |
| Example 17 | $Cl_2$ | 5 | 0 |
| Example 18 | NO | 5 | 0 |
| Example 19 | $F_2$ | 5 | 0 |
| Example 20 | $NF_3$ | 5 | 0 |
| Example 21 | $OF_2$ | 5 | 0 |
| Example 22 | $ClO_3F$ | 5 | 0 |

As is evident from Table 1, when the air tight case was filled with a filler gas having an oxygen concentration equal to or higher than 1 vol %, no unlighted pixels due to short circuits were produced. However, when the airtight case was filled with a nitrogen gas having an oxygen concentration equal to or higher than 20 vol %, a black spot (luminescence-disabled portion) was visually recognized to expand. Therefore, especially when the organic EL element is used in severe environments, it is preferred that a filler gas has an oxygen concentration not lower than 1 vol % and lower than 20 vol %.

As is evident from Table 2, when the airtight case was filled with a filler gas having a dinitrogen oxide concentration equal to or higher than 2 vol %, no unlighted pixels due to short circuits were produced.

As is evident from Table 3, when the airtight case was filled with a filler gas having a combustion supporting as of ozone, chlorine, nitrogen monoxide, fluorine, nitrogen trifluoride, oxygen difluoride, or chlorine trioxide fluoride, with a concentration of 5 vol % each, no pixels due to short circuits were produced.

Although in the above Examples, a filler gas was separately or independently formed of one of combustion supporting gases of oxygen, dinitrogen oxide, ozone, chlorine, nitrogenmonoxide, fluorine, nitrogen trifluoride, oxygen difluoride, and chlorine trioxide fluoride, this is not limitative but more than one of these combustion supporting gases can be included in the filler gas.

As described above, when a filler gas containing at least one combustion supporting gas, such as oxygen, is used to enclose the organic EL elements in a sealed manner, an organic EL element can be obtained which is free from occurrence of a short circuit and hence has an enhanced reliability.

Although in the above embodiment, the organic EL display device includes a two-layered organic compound group formed by the hole transport layer 3 and the organic light-emitting layer 4 sandwiched between the electrodes, this is not limitative, but an electron transport layer of an organic compound may be formed between the cathode 6 and the organic light-emitting layer 4. Further, an inorganic light-emitting layer may be used instead of the organic light-emitting layer 4.

Furthermore, water $H_2O$ has the most adverse aging effect on the organic EL element 10 among the three substances nitrogen $N_2$, oxygen $O_2$, and water $H_2O$. Therefore, an air-permeable container containing a desiccant of diphosphorus pentaoxide $P_2O_5$, barium oxide BaO or the like may be provided on the inner wall surface of the airtight case 20 at a location opposed to the organic compound layer group separately from the group and the cathodes, to thereby protect the organic EL elements 10 from water $H_2O$ and moisture.

What is claimed is:

1. An organic electroluminescent display device comprising:

a substrate;

an organic electroluminescent element formed on said substrate, said organic electroluminescent element having an organic compound layer group sandwiched between cathodes and anodes, said organic compound layer group comprising laminated electroluminescence functional layers formed of at least one kind of organic compound;

an airtight case that encloses said organic electroluminescent element including said organic compound layer group, said cathodes and said anodes with a space formed between said airtight case itself and said organic electroluminescent element, and isolates said organic electroluminescent element from outside air; and a filler gas filling said space within said airtight case, said filler gas including at least one kind of combustion supporting gas.

2. An organic electroluminescent display device according to claim 1, wherein said combustion supporting gas is oxygen gas.

3. An organic electroluminescent display device according to claim 2, wherein a concentration of said oxygen gas is equal to or higher than 1 vol % in said filler gas.

4. An organic electroluminescent display device according to claim 1, wherein said combustion supporting gas is dinitrogen oxide gas.

5. An organic electroluminescent display device according to claim 4, wherein a concentration of said dinitrogen oxide gas is equal to or higher than 2 vol % in said filler gas.

6. An organic electroluminescent display device according to claim 1, wherein said combustion supporting gas is ozone gas.

7. An organic electroluminescent display device according to claim 1, wherein said combustion supporting gas is chlorine gas.

8. An organic electroluminescent display device according to claim 1, wherein said combustion supporting gas is nitrogen monoxide gas.

9. An organic electroluminescent display device according to claim 1, wherein said combustion supporting gas is fluorine gas.

10. An organic electroluminescent display device according to claim 1, wherein said combustion supporting gas is nitrogen trifluoride gas.

11. An organic electroluminescent display device according to claim 1, wherein said combustion supporting gas is oxygen difluoride gas.

12. An organic electroluminescent display device according to claim 1, wherein said combustion supporting gas is chlorine trioxide fluoride gas.

13. An organic electroluminescent display device according to claim 1, wherein said filler gas includes at least of one of nitrogen gas and inert gases.

* * * * *